(12) United States Patent
Straub

(10) Patent No.: US 6,257,478 B1
(45) Date of Patent: Jul. 10, 2001

(54) SOLDERING/UNSOLDERING ARRANGEMENT

(75) Inventor: Jürgen Straub, Neuenstadt (DE)

(73) Assignee: Cooper Tools GmbH, Besigheim (DE)

( * ) Notice: Subject to any disclaimer, the term of this patent is extended or adjusted under 35 U.S.C. 154(b) by 0 days.

(21) Appl. No.: 09/319,584

(22) PCT Filed: Nov. 12, 1997

(86) PCT No.: PCT/EP97/06317
§ 371 Date: Sep. 9, 1999
§ 102(e) Date: Sep. 9, 1999

(87) PCT Pub. No.: WO98/25725
PCT Pub. Date: Jun. 18, 1998

(30) Foreign Application Priority Data

Dec. 12, 1996 (DE) .......................... 296 21 604 U

(51) Int. Cl.⁷ .................. B23K 1/012; B23K 1/018; B23K 3/04
(52) U.S. Cl. .................. 228/6.2; 228/264; 228/20.1; 228/119
(58) Field of Search .................. 228/119, 264, 228/6.2, 20.1; 219/228, 229, 234, 240, 415, 444.1, 526

(56) References Cited

U.S. PATENT DOCUMENTS 4,295,596 * 10/1981 Doten et al. .
4,444,559 * 4/1984 Schink et al. .
4,552,300 * 11/1985 Zavko et al. .
4,752,025 * 6/1988 Stach et al. .
4,767,047 * 8/1988 Todd et al. .
4,858,820 * 8/1989 Kent .
5,320,273 * 6/1994 Goenka et al. .
5,419,481 * 5/1995 Lasto et al. .
5,560,531 * 10/1996 Ruszowski .
5,603,857 * 2/1997 Mickle .
5,814,789 * 9/1998 O'Leary et al. .
5,862,588 * 1/1999 Heim et al. .

* cited by examiner

Primary Examiner—Tom Dunn
Assistant Examiner—Colleen P. Cooke
(74) Attorney, Agent, or Firm—Coats & Bennett, P.L.L.C.

(57) ABSTRACT

A soldering/desoldering device, in particular for integrated circuits with electric/electronic components, comprises a heater nozzle having a substantially bell-shaped housing formed with a lower nozzle opening. A heat distribution plate which can be acted upon by hot gas is arranged in the heater nozzle. An edge of the heat distribution plate and the housing have formed thereinbetween at least one passage opening for hot gas flowing towards the nozzle opening. In order to attain a uniform heat distribution for soldering or desoldering purposes and to simultaneously reduce the discharge of hot gas from the heater nozzle, at least one return opening for hot gas flowing through the passage opening is disposed in spaced-apart relationship with the passage opening in the heat distribution plate.

35 Claims, 3 Drawing Sheets

SOLDERING/UNSOLDERING ARRANGEMENT

DESCRIPTION

The present invention relates to a soldering/desoldering device, in particular for integrated circuits with electric/electronic components, the device comprising a heater nozzle with a substantially bell-shaped housing formed with a lower nozzle opening, the heater nozzle having disposed therein a heat distribution plate which can be acted upon by a hot gas, and an edge of the heat distribution plate and the housing having formed thereinbetween at least one passage opening for hot gas flowing towards the nozzle opening.

Such a soldering/desoldering device is known from German Utility Model Application G 93 04 784. In the prior-art soldering/desoldering device, a heat distribution plate which is formed as a nozzle bottom is heated by a hot gas flow passed through the heater nozzle. To this end the nozzle bottom is made of a material of high thermal conductivity. The nozzle bottom can be put on a surface of a component to be soldered or desoldered. At least one passage opening which permits the passage of hot gas towards leads of the component to be heated is formed between the edge of the nozzle bottom and the housing of the heater nozzle.

A sufficient amount of heat for soldering or desoldering purposes is transferred to the corresponding soldering points by the hot gas flowing through the passage opening and through the nozzle bottom which is heated by being acted upon with hot gas.

In the known soldering/desoldering device, the heat distribution plate is heated by being acted upon with hot gas only from its upper side opposite to the component. Furthermore, the entire hot gas flow exits through the nozzle opening and laterally from the component anf flows along a printed circuit board which has arranged thereon printed circuits and further components. As a result, on the one hand, the heat distribution plate is heated to an increased degree, in particular on its upper side and on the edge facing the passage opening, and, on the other hand, the hot gas which flows off along the printed circuit board may damage the circuit boards and/or further components.

It is therefore the object of the present invention to improve the above-described soldering/desoldering device in such a manner that a uniform heat distribution for soldering or desoldering purposes is attained and that the discharge of hot gas from the heater nozzle is reduced at the same time.

This object is achieved in a soldering/desoldering device comprising the features of the preamble of claim 1 in that at least one return opening for hot gas flowing through the passage opening is disposed in spaced-apart relationship with the passage opening in the heat distribution plate.

As a result, the heat distribution plate is heated from its upper side, in its edge facing the passage opening and in the surroundings of the return opening. This effects, in particular, a uniform heat distribution in the area between edge and return opening, said edge being preferably assigned to the portions of the component which are to be soldered or desoldered. Furthermore, at least part of the hot gas otherwise exiting from the nozzle opening is guided away, e.g. from a printed circuit board, through the return opening so that a smaller amount of hot gas acts on printed circuit boards or other components.

It should be noted that the heat distribution plate is preferably a plate-shaped body having an even upper side and bottom side. However, it is also possible that the heat distribution plate is only even in the sections of its bottom side that face the portions of the component to be soldered or desoldered, and that it has an upper side, or the like, which e.g. obliquely extends downwards towards the passage opening in the direction of the nozzle opening. A plate-shaped distribution plate is in principle only the heat distribution body which can be produced in the easiest manner.

Further non-generic soldering/desoldering devices are known. For instance, DE 44 22 341 discloses a heater nozzle which has disposed therein a hot gas distribution plate with openings of different diameters. The hot gas is thereby to be supplied in a quantitatively controlled manner to an upper side of a component. The hot gas will then exit laterally out of openings in a housing of the heater nozzle.

Furthermore, U.S. Pat. No. 4,752,025 discloses a soldering/desoldering device in which an end plate which partly closes a nozzle opening is arranged in the nozzle opening of a heater nozzle. On account of such an arrangement, the hot gas can only exit next to the side walls of a housing of the nozzle towards the leads of a component. Subsequently, the hot gas which flows off along the leads and the printed circuit board can be sucked off through a sleeve partly gripping over the nozzle.

U.S. Pat. No. 4,295,596 discloses a further soldering/desoldering device in which a heater nozzle comprises a double-walled housing having an inner wall and an outer wall. A suction device is adjustably arranged in vertical direction within the cavity surrounded by the inner wall. Hot gas is supplied between the inner wall and the outer wall. The hot gas flows out of openings which are next to a lower nozzle opening and are directed substantially radially inwards. The exiting hot gas can be sucked off through the cavity surrounded by the inner wall.

U.S. Pat. No. 4,552,300 shows a soldering/desoldering device in which in the case of a desoldering operation hot gas is returned via a central bore into a housing of the device. In such a case the heating operation is only performed through the supply of hot gas to the soldering points without a heat distribution plate or the like. The hot gas is supplied via lateral, vertically extending channels to the soldering point and the supplied gas is heated during the supply. In the case of a soldering action the hot gas is discharged to the outside substantially radially away from the component to be soldered.

To use an inexpensive housing of a simple construction, the housing may comprise a cover wall and a circumferential wall which is connected to said cover wall and which opposite to said cover wall surrounds the nozzle opening.

To supply the hot gas in a simple manner already in the direction of the nozzle opening to the housing, at least one supply opening for the hot gas can be formed in the cover wall. The hot gas flows through the supply opening towards the heat distribution plate To secure the suction pipe in an easy manner in the heat distribution plate, an opening edge of a lower opening of the suction pipe can grip behind an edge of the suction opening and positively hold said edge, for example with a part of the suction pipe standing on the upper side of the heat distribution plate.

For an improved holding of the component and for an improved sealing of the suction pipe, a suction insert may be insertable in the lower opening of the suction pipe.

To be able to suck the component in an easier manner outside of the housing through the suction means or to be able to place it on a printed circuit board without being visibly impeded by the housing, the suction pipe and/or a suction nozzle which is arranged within the suction pipe can be supported such that it is longitudinally adjustable and/or rotatable relative to the heat distribution plate. As for the suction nozzle, said nozzle is tubularly arranged inside the suction pipe and supported to be adjustable/and or rotatable relative to said pipe. As a result, the suction nozzle can be moved out of the lower opening of the suction pipe and can project beyond the bottom side of the heat distribution plate.

For an improved and sealed suction of the component, the suction insert may be detachably secured to a lower end of the suction nozzle. As a result of the longitudinal adjustability and/or rotatability of suction pipe and/or suction nozzle, the component can be sucked outside the housing and supplied in fitting fashion to the housing for being partly received therein.

For an adaptation to the circumference of a component, and in order to receive the component, at least in part, in the nozzle opening with a projection that is as small as possible towards neighboring components, or the like, the cover wall extends in a substantially horizontal direction and has a four-cornered circumference, with the circumferential wall being formed by four side walls that extend in a substantially vertical direction relative to the cover wall. The four-cornered circumference corresponds to the circumference of the component. The housing can be designed as a replaceable exchange part which can be adapted to the respective component.

In components having laterally projecting leads, it is advantageous when a certain amount of hot gas exits between lower ends of the side walls and, for instance, the printed circuit board, and heats the leads possibly extending beyond the side walls for soldering or desoldering purposes. However, when a component having soldering points arranged between the component and the printed circuit board, i.e. a so-called ball-grid array, is to be soldered or desoldered, a deflection of the hot gas flow towards the component, i.e. towards the soldering points, is of advantage. In such a case the housing can entirely surround the component with its soldering points and be put on the printed circuit board. To prevent hot gas from exiting from the housing in such a case, it is advantageous when a sealing edge is formed by lower ends of the side walls. This sealing edge is positioned on the printed circuit board outside of the component and, on the one hand, assists together with the printed circuit board in deflecting the hot gas flow towards the soldering points and, on the other hand, largely prevents the hot gas from exiting from the housing. The hot gas flow is here guided away from the printed circuit board and the component via the return opening or openings.

As a rule, a component is soldered along its entire circumference via laterally projecting leads or corresponding soldering points. In this connection it turns out to be advantageous when a respective passage opening for hot gas is formed between each side wall and the edge of the heat distribution plate. All leads or soldering points are thereby heated at the same time.

In the simplest case the passage opening is designed as a passage slot. The slot has a length corresponding at least to the portion of the component on which corresponding leads or soldering points are provided.

In the simplest case the passage opening extends substantially over the entire length of the side wall. To simplify the assembly of the heater nozzle and to restrict the passage openings or passage slots to a portion along the side walls at the same time, the heat distribution plate may comprise alignment projections in the corners thereof. Said projections are oriented towards corresponding connection corners of two respective side walls and can there define the passage opening or the passage slot.

The return opening or openings can be designed in accordance with the passage openings, i.e. for example as a passage slot. In the simplest case it is sufficient to arrange return openings in each corner of the heat distrubtion plate in said plate. Very simple embodiments of return openings may have a substantially circular circumference.

The return openings may be designed as bores in the heat distribution plate. To avoid a situation where hot gas returned through the heat distribution plate simply exits at the upper side of the heat distribution plate, the return openings may be formed by pipe members secured within the heat distribution plate. These pipe members may project downwards and also upwards beyond the heat distribution plate. Ends of the pipe members which project upwards beyond the upper side of the heat distribution plate may be curved such that they are substantially oriented in the direction of the hot gas which flows off at the upper side. The hot gas to be returned is thereby discharged by the hot gas flowing towards the passage openings, substantially in the manner of a water jet pump.

The pipe members can in particular terminate in planar flush configuration in the heat distribution plate at the lower side of the plate which is oriented towards the nozzle opening. Thus the heat distribution plate can e.g. also be placed on an upper side of the component.

To discharge hot gas via the return openings from the housing, in particular when the housing sealingly rests on the printed circuit board, the pipe members may terminate in an upper side of the cover wall which faces the pipe union. The returned gas can thereby be removed from the housing. It is also possible to combine pipe members with different functions with one another, i.e. pipe members terminating above the heat distribution plate and in the upper side of the cover wall.

To prevent the hot gas in such a case, for instance, from being guided towards a user of the soldering/desoldering device, such a pipe member may be connected via a return line to a source of hot gas which the hot gas is returned to in a closed circuit for renewed heating.

To control the return in such a case for achieving a specific soldering or desoldering temperature or for using a specific amount of hot gas, the pipe members may be connected to a forced return means for the hot gas. Such a forced return means may e.g. be a pump by which hot gas can be pumped off in a controlled manner through the return openings. It is thereby possible to control, e.g., the temperature on the component or also the flow rate of the hot gas flow.

When the heat distribution plate is mounted in an inadjustable manner relative to the housing within the latter, a distance between the bottom side of the heat distribution plate and the sealing edge of the side walls is of advantage, the distance being at least as great as a constructional height of the component to be soldered or desoldered. In a heat distribution plate which is adjustably supported within the housing, in particular in a direction perpendicular to the component, the distance can be adjusted accordingly.

In order to obtain a heat distribution plate which can very efficiently replace an infrared heating source, which is known per se, at the side of the circuit or board opposite to the component, the heat distribution plate may be made from a material of a high infrared emissivity—at least on its bottom side. Such a material is e.g. blackened steel, with the heat distribution plate as such being also producible from steel.

It is just as well possible that the bottom side of the heat distribution plate is provided with a coating of a material of a high infrared emissivity, the material differing e.g. from the material of the heat distribution plate. Such a material is e.g. enamel and, in particular, white enamel.

An advantageous embodiment of the invention will now be explained and described in more detail with reference to the figures attached to the drawing, in which.

Figure 1:
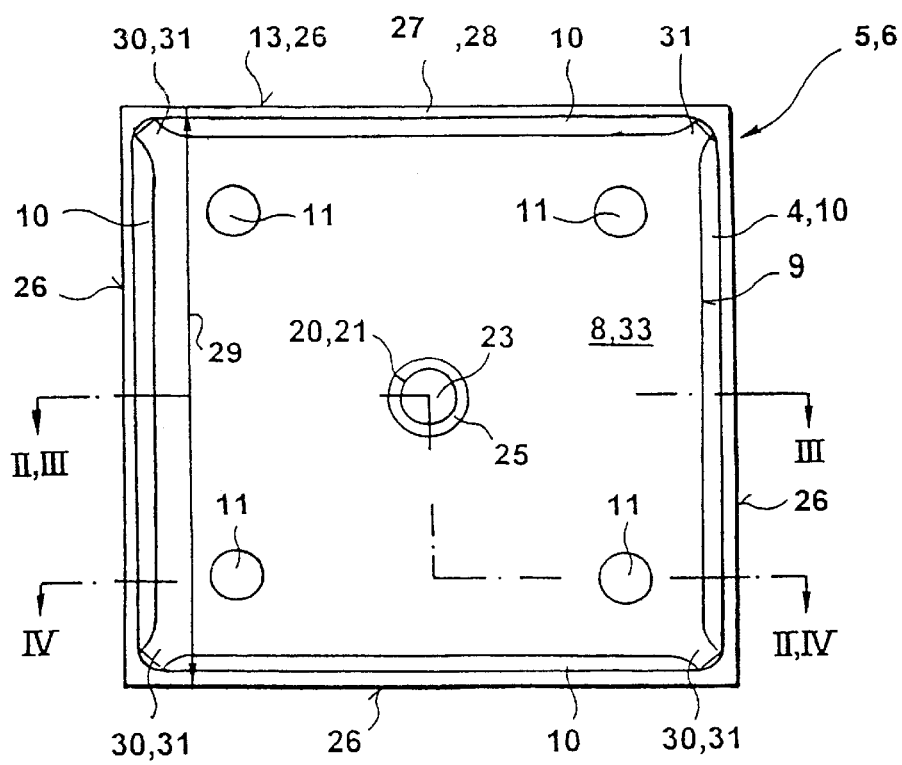
FIG. 1 is a bottom view of a heater nozzle of a soldering/desoldering device according to the invention.

FIG. 1 is a top view taken from below of a soldering/desoldering device according to the invention, which shows, in particular, a bottom side 33 of a heat distribution plate 8. The plate has an approximately square contour with alignment projections 31 oriented outwards in the corners 30 thereof. Four return openings 11 which extend through the heat distribution plate 8 are formed in the heat distribution plate 8 in spaced relationship with the corners 30.

A housing 5 of a heater nozzle 6 of the soldering/desoldering device is also provided with an approximately square contour which is formed by four side walls 26 forming a circumferential wall 13. The side walls 26 define a nozzle opening 4 into which the heat distribution plate 8 is inserted. The nozzle opening 4 is narrowed by an edge 9 of the heat distribution plate 8 and the side walls 26 to slot-shaped passage openings 10 which extend substantially over the whole length 29 of the side walls 26.

The slot-shaped passage openings 10 respectively extend to the respective alignment projections 31 and are in parallel with the edge 9 or the side walls 26.

A suction opening 25 is centrally arranged in the heat distribution plate 8. A lower opening 23 of a suction pipe 21 of a suction means 20 terminates in said opening 25. The suction means 20 will be described in more detail in the following.

Figure 2:
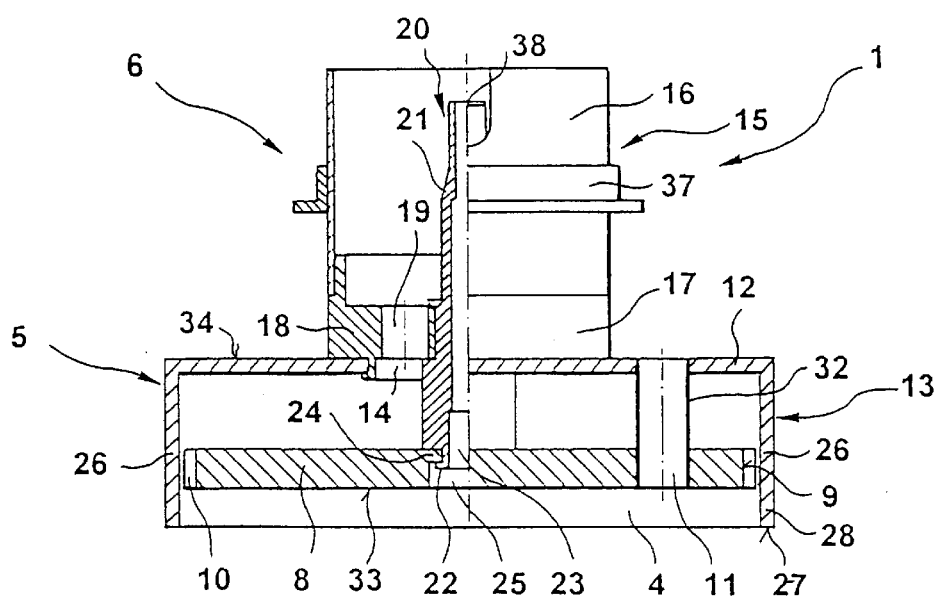
FIG. 2 is a section taken along line II—II according to FIG. 1.

FIG. 2 is a section taken along line II—II of FIG. 1. Identical parts are designated by identical reference numerals in FIG. 2 and in the subsequent figures.

As for the soldering/desoldering device 1 according to the invention, the heater nozzle 6 with housing 5 and pipe union 15 are in particular shown. The housing 5 is approximately bell-shaped. It has a horizontal cover wall 12 from which four side walls 26 project vertically along the circumference thereof as a circumferential wall 13; see also FIG. 1.

With their lower ends 28 the side walls 26 define the nozzle opening 4 out of which hot gas which has been supplied via the pipe union 15 can flow. Furthermore, the lower ends 28 form a sealing edge 27, which will in particular be illustrated in the following in connection with FIG. 4.

The heat distribution plate 8 is arranged inside the housing 5. The passage openings 10 are formed between the edge 9 of the plate and the side walls 26.

The suction opening 25 is centrally formed in the heat distribution plate 8. The suction pipe 21 of the suction means 20 terminates in said opening. The lower opening 23 of the suction pipe 21 has a radially outwardly projecting opening edge 22 which grips behind a corresponding opening edge 24 which radially projects inwards into the suction opening 25.

The suction pipe 21 extends in a direction perpendicular to the heat distribution plate 8 and concentrically passes through a supply opening 14 formed in the cover wall 12. The suction pipe 21 extends up to approximately the upper end of the pipe union 15. Said union serves to fasten the heater nozzle 6 to the remaining soldering/desoldering device 1 (not shown). The suction pipe 21 is terminated by an entry opening 38 to which a vacuum source (not shown) can be connected.

Furthermore, a lower end of the pipe union 15 is inserted into the supply opening 14 and fastened thereto. The pipe union 15 comprises a connection pipe member 16 and a distribution pipe member 17, both members having substantially the same outer diameter. The connection pipe member 16 is attached from above onto the distribution pipe member 17. Furthermore, a holding flange 37 is secured to the outside of the connection pipe member 16.

The distribution pipe member 17 comprises a pipe bottom 18 which rests on an upper side 34 of the cover wall 12. Said bottom has arranged therein a plurality of distribution openings 19 for supplying and distributing hot gas in the housing 5. In addition to being secured within the heat distribution plate 8, the suction pipe 21 is secured in the pipe bottom 18 of the distribution pipe member 17.

In the section shown in FIG. 2, a return opening 11 is visible in the heat distribution plate 8. The opening is formed by a pipe member 32 which terminates in planar flush configuration in a bottom side 33 of the heat distribution plate 8 which is opposite to the cover wall 12. The pipe member 32 extends up to an upper side 34 of the cover wall 12 which is opposite to the heat distribution plate 8. At this place the pipe member 32 also terminates in planar flush configuration. The pipe member 32 is arranged in spaced-apart relationship with the edge 9 of the heat distribution plate and is thus in spaced-apart relationship with the passage opening 10. Contour and distribution of the return openings 11 are illustrated by way of example in FIG. 1.

Figure 3:
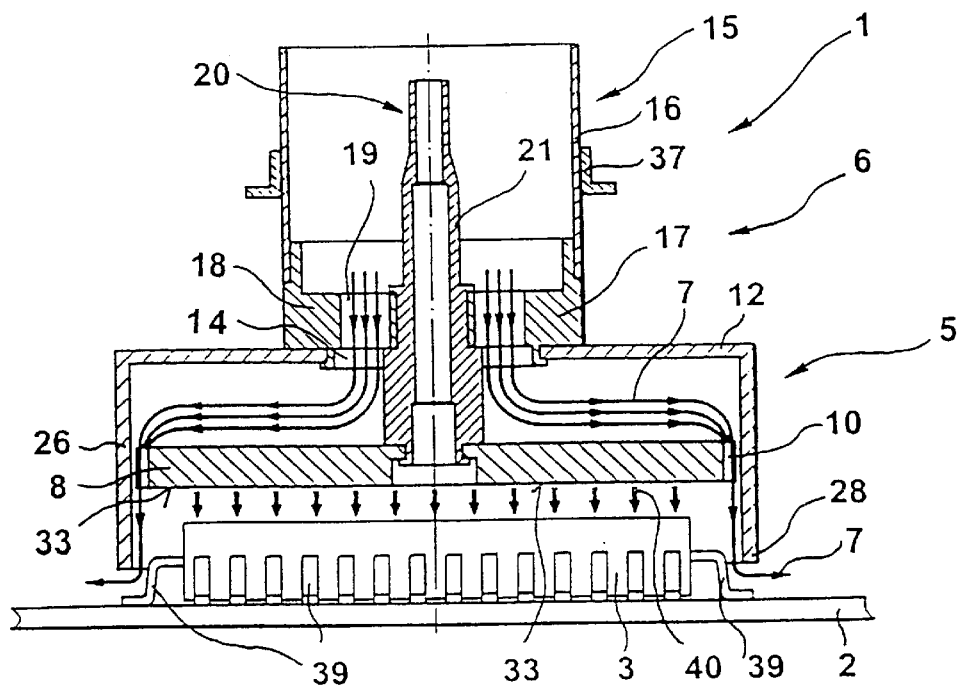
FIG. 3 is a section taken along line III—III of FIG. 1.
Figure 4:
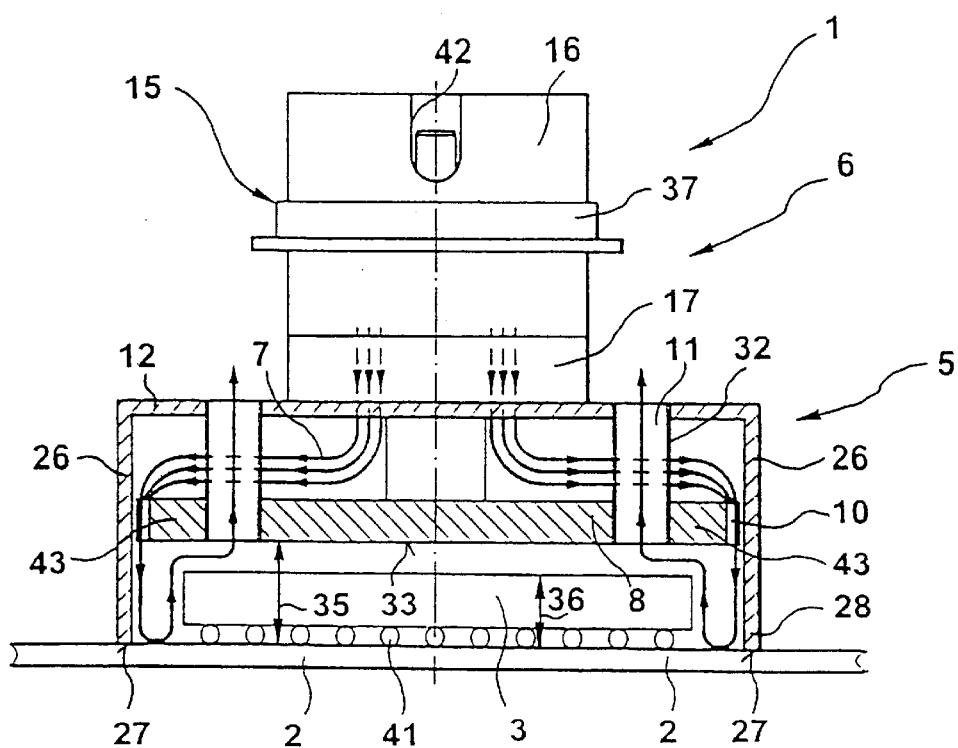
FIG. 4 is a section taken along line IV—IV of FIG. 1.

The subsequent FIGS. 3 and 4 show two different applications of the soldering/desoldering device 1. In FIG. 3, the soldering/desoldering device with its heater nozzle 6 serves to solder or desolder a component 3 having leads 39 laterally projecting therefrom. The component 3 is mounted on a printed circuit board or an integrated circuit 2. The illustration according to FIG. 3 corresponds to a section taken along line III—III of FIG. 1.

Hot gas 7 can be supplied via the pipe union 15 to the leads 39, as shown by the continuous lines provided with arrows. The hot gas 7 flows through the distribution openings 19 in the pipe bottom 18 and along the heat distribution plate 8 towards the passage openings 10. At this place, the hot gas 7 is deflected along the side walls 26 towards the printed circuit board 2 and impinges next to the lower ends 28 of the side walls 26 on the leads 39. Thanks to the arrangement of the passage openings 10 according to FIG. 1, hot gas is uniformly and simultaneously supplied to all leads laterally projecting from the component 3.

Part of the hot gas 7 can be returned via the return openings 11 through the heat distribution plate 8 and can be discharged out of the housing 5, see FIG. 2, upwardly through the cover wall 12.

The component 3 and, in particular, the leads 39, are heated twice by the way how the hot gas is guided. On the one hand, the hot gas directly impinges on the leads 39. On the other hand, the heat distribution plate 8 is heated by the hot gas 7 flowing between said plate and the cover wall 12 through the passage openings 10 and through the return openings 11. As a result, the heat distribution plate 8 additionally serves to heat the component 3 and thus the leads 39, as illustrated by the heat radiation 40 represented by arrows. As a result, component 3 and leads 39 need, for instance, not additionally be heated, for example by an infrared radiator, from the side of the printed circuit board 2 that is opposite to the component 3.

FIG. 4 is a section through the heater nozzle 6 along line IV–IV of FIG. 1. In this instance the soldering/desoldering device 1 serves to solder or desolder a component 3 having soldering points 41 arranged at the bottom side of said component. Such an arrangement of the soldering points is generally referred to as a ball-grid array (BGA). The soldering points 41 are arranged between component 3 and printed circuit board 2. In such a BGA, the housing 5 is mounted on the printed circuit board 2, so that a seal is established between housing 5 and printed circuit board 2 by the sealing edge 27 formed by the lower ends 28 of the side walls 26. In the embodiment shown in FIG. 3, hot gas 7 flows through the distribution opening 19 between heat distribution plate 8 and cover wall 12 and through the passage openings 10 downwards towards the printed circuit board 2. The hot gas 7 is laterally deflected towards the component 3 by virtue of the seal existing between side walls 26 and printed circuit board 2, and is discharged from there towards the heat distribution plate 8 and via the return openings 11 upwards towards the pipe union 15. Due to the way how the hot gas 7 is guided, edge portions 43 of the heat distribution plate 8 are in particular heated to a greater degree, said edge portions enhancing the heating of the soldering points 41 by way of the hot gas flow deflected towards component 3. In this connection it should be noted that the soldering points 41 are normally arranged in the edge portions of the component 3 near the outer circumference thereof.

In addition, the whole heat distribution plate 8 acts as a heat radiator, as is also the case in FIG. 3, with the corresponding heat radiation 40 being not shown in FIG. 4 for the sake of simplification.

A distance 35 between the bottom side 33 of the heat distribution plate 8 and the printed circuit board 2 is normally greater than a constructional height 36 of the component 3, so that hot gas can also be returned when the return openings 11 are covered by the component 3. In the embodiment according to FIG. 3, the heat distribution plate 8 can also be mounted with its bottom side 33 on the component 3.

Figure 5:
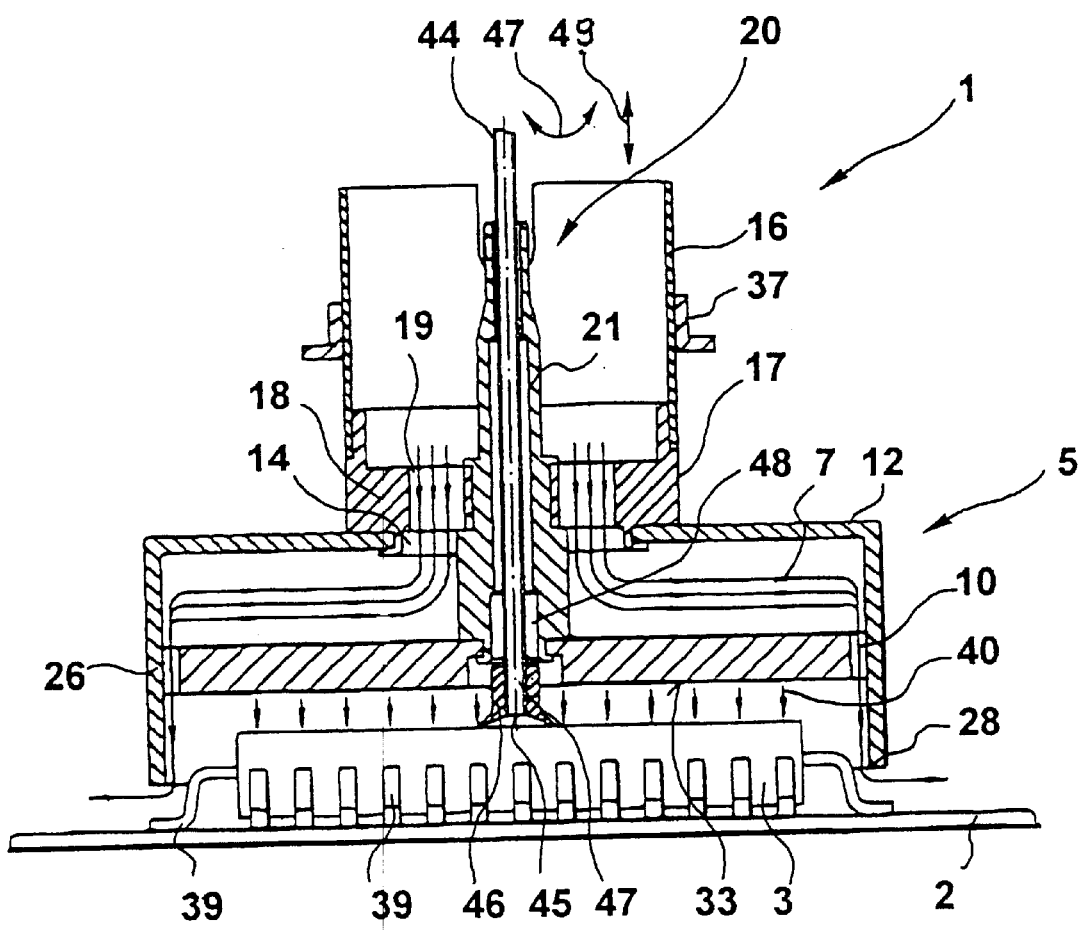
FIG. 5 is a section analogous to FIG. 3, taken along line III—III of FIG. 1, in a further embodiment of a soldering/desoldering device according to the invention.

A suction insertion which is inserted into the bottom opening 23 of the suction pipe 21, see e.g. FIG. 2 or 3, is not shown for the sake of simplification. Such a suction insert, see FIG. 5, is per se known and extends over the bottom side 33 of the heat distribution plate 8 towards the component 3. A sealing coupling of the suction pipe 21 to the component 3 is ensured by the suction insert.

Furthermore, the figures do e.g. not show a source of hot gas for generating and supplying hot gas to the pipe union 15, nor a forced return means for hot gas discharged at the upper side 34 of the cover wall 12. Thanks to such a forced return means, hot gas can be withdrawn in a controlled manner through the return openings 11 from the housing 5 and can e.g. also be returned to the source of hot gas. In particular in the embodiment according to FIG. 4, a substantially closed circuit for hot gas is thereby formed. Furthermore, an alignment slot 42 through which an aligned arrangement and fastening of the heater nozzle 6 is possible on the remaining soldering/desoldering device 1 (not shown) is formed in FIG. 4 on the upper end of the connection pipe member 16.

FIG. 5 is a section analogous to FIG. 3 along line III—III of FIG. 1, see also FIG. 3 with a further embodiment of the soldering/desoldering device 1 according to the invention. Identical numerals again designate identical components and will only be mentioned in part.

The embodiment according to FIG. 5 differs from that of FIG. 3 in that a tubular suction nozzle 44 is supported in the suction pipe 21 of the suction means 20 such that it is adjustable in longitudinal direction 49 and rotatable in directions 47 within the suction pipe 21. The suction nozzle 44 projects with its lower end 47 from the bottom opening 23, see FIG. 2. A suction insert 46 is detachably secured to said lower end 47. The suction insert surrounds a lower opening 45 of the suction nozzle 44 with a sealing edge extending obliquely downwards towards the upper side of the component 3.

The suction nozzle 44 is retractable at least up to the receiving means 48 which is made complementary to the suction insert 46 and which is adjacent to the lower opening of the suction pipe 21 in the direction of the connection pipe member 16.

An analogous suction nozzle with a suction insert is also insertable in the case of components 3 having a ball-grid array, see FIG. 4.

What is claimed is:

1. A soldering/desoldering device (1), for integrated circuits (2) with electric/electronic components (3), comprising a heater nozzle (6) with a substantially bell-shaped housing (5) formed with a lower nozzle opening (4), said heater nozzle (6) having disposed therein a heat distribution plate (8) which can be acted upon by a hot gas (7), and an edge (9) of the heat distribution plate (8) and the housing (5) having formed thereinbetween at least one passage opening (10) for hot gas flowing towards the nozzle opening (4), characterized in that at least one return opening (11) for hot gas (7) flowing through the passage opening (10) is disposed in spaced-apart relationship with the passage opening (10) in the heat distribution plate (8) and spaced substantially inwardly from said passage opening, said return opening venting said hot gas from said nozzle opening after said hot air has flown over the top of said component.

2. A soldering/desoldering device according to claim 1 comprises a cover wall and a peripheral wall connected to said cover wall, said peripheral wall and said cover wall jointly surrounding said nozzle opening.

3. The soldering/desoldering device according to claim 2, characterized in that at least one supply opening (14) for hot gas (7) is formed in said cover wall (12).

4. The soldering/desoldering device according to claim 3, characterized in that a pipe union (15) for connection to a hot gas line of the soldering/desoldering device communicates with said supply opening (14).

5. The soldering/desoldering device according to claim 4, characterized in that the pipe union (15) comprises at least one connection pipe member (16) and a distribution pipe member (17) arranged between said connection pipe member and said supply opening (14).

6. The soldering/desoldering device according to claim 4, characterized in a pipe bottom (18) is arranged in the distribution pipe member (17) with a plurality of distribution openings (19) communicating with said supply opening (14).

7. The soldering/desoldering device according to claim 6 wherein said pipe bottom holds a suction means, said suction means extends to a suction opening in said heat distribution plate.

8. The soldering/desoldering according to claim 1 characterized in that the suction means (20) comprises a suction pipe (21) which coaxially extends in the said pipe union (15) and is connectable to a vacuum source.

9. The soldering/desoldering device according to claim 1, characterized in that an opening edge (22) of a lower opening (23) of the suction pipe (21) grips behind an edge (24) of the suction opening (25).

10. The soldering/desoldering device according to claim 9, characterized in that a suction insert is insertable in said lower opening (23).

11. A soldering/desoldering device according to claim 8 wherein said suction pipe is moveable relative to the heat distribution plate.

12. The soldering/desoldering device according to claim 1, characterized in that the suction insert (46) is detachably secured to a lower end (47) of the suction nozzle (44).

13. The soldering/desoldering device according to claim 2 wherein said cover wall extends in a substantially horizontal direction and has a four-cornered perimeter, said peripheral wall comprising four side walls which extend in a direction substantially perpendicular to said cover wall.

14. The soldering/desoldering device according to claim 13, characterized in that a sealing edge (27) is formed by lower ends (28) of said side (26).

15. The soldering/desoldering device according to claim 13, characterized in that a respective passage opening (10) is formed between each side wall (26) and said edge (9) of said heat distribution plate (8).

16. The soldering/desoldering device according to claim 1, characterized in that said passage opening (10) is formed as a slot.

17. The soldering/desoldering device according to claim 1, characterized in that the passage opening (10) extends substantially over the entire length (29) of said side wall (26).

18. The soldering/desoldering device according to claim 1 claims, characterized in that said heat distribution plate (8) comprises alignment projections (31) in the corners (30) thereof.

19. The soldering/desoldering device according to claim 1 further comprising a plurality of return openings in said heat distribution plate disposed proximate corners thereof.

20. The soldering/desoldering device according to claim 19, characterized in that the return opening (11) is a substantially circular circumference.

21. The soldering/desoldering device according to claim 19, characterized in that said return opening (11) is formed by a pipe member (32) secured within said heat distribution plate (8).

22. The soldering/desoldering device according to claim 21, characterized in that the pipe member (32) terminates in substantially planar flush configuration in a bottom side (33) of said heat distribution plate (8) which faces said nozzle openings (4).

23. The soldering/desoldering device according to claim 1 wherein said housing further comprises a cover wall having an upper side opposite said heat distribution plate and further comprising a plurality of return openings in said heat distribution plate disposed proximate corners thereof, and wherein said return openings are formed by a pipe member terminating on said upper side of said cover wall.

24. The soldering/desoldering deivce according to claim 21, characterized in that the pipe member (32) is connected via a return line to a source of hot gas.

25. The soldering/desoldering device according to claim 21, characterized in that the pipe member (32) is connected to a forced return means for hot gas (7).

26. The soldering/desoldering device according to claim 13 wherein said heat distribution plate has a bottom side, and wherein said side walls include a sealing edge, and wherein a distance between said sealing edge and said bottom side is greater than or equal to a height of a component which is to be soldered or desoldered.

27. The soldering/desoldering device according to claim 1, characterized in that said heat distribution plate (8) is provided at least on its bottom side (33) with a material of high infrared emissivity.

28. The soldering/desoldering device according to claim 27, characterized in that said bottom side (33) has a coating made of a material of high infrared emissivity.

29. A soldering/desoldering device according to claim 8 further including a suction nozzle disposed in said suction pipe, and wherein said suction nozzle is moveable relative to the heat distribution plate.

30. A device for soldering/desoldering an integrated circuit component to/from a printed circuit board, comprising:

a heater nozzle housing having an inner peripheral wall substantially surrounding a nozzle opening on a distal end thereof;

a heat distribution plate disposed within said heater nozzle housing upstream from said nozzle opening;

a first inlet passage defined at least partially by said heat distribution plate, said first inlet passage opening into a peripheral portion of said nozzle opening;

a second inlet passage defined at least partially by said heat distribution plate, said second inlet passage opening into a peripheral portion of said nozzle opening opposite said first inlet passage;

at least one exhaust passage extending through said heat distribution plate and communicating with said nozzle opening at a position substantially inward from said inner peripheral wall;

a hot air supply communicating with said nozzle opening via said first and second inlet passages;

wherein, with said nozzle opening placed over the integrated circuit component and abutting the printed circuit board, hot air flows from said hot air supply, through said first and second inlet passages into said nozzle opening, over at least a portion of the top of the integrated circuit component, and out of said nozzle opening via said at least one exhaust passage.

31. The device of claim 30 wherein said nozzle opening has a rectilinear perimeter having first, second, third, and fourth perimeter wall, and wherein said first inlet passage opens into said nozzle opening along substantially all of said first perimeter wall and said second inlet passage opens into said nozzle opening along substantially all of said second perimeter wall.

32. The device of claim 30 wherein said first and second inlet passages are defined by said heat distribution plate and said heater nozzle housing.

33. The device of claim 30 further including:

a third inlet passage defined at least partially by said heat distribution plate, said third inlet passage opening into a peripheral portion of said nozzle opening spaced from said first inlet passage;

a fourth inlet passage defined at least partially by said heat distribution plate, said fourth inlet passage opening into a peripheral portion of said nozzle opening opposite said third inlet passage;

a plurality of exhaust passages extending through said heat distribution plate and communicating with said nozzle opening at positions substantially inward from said inner peripheral wall;

wherein, with said nozzle opening placed over the integrated circuit component and abutting the printed circuit board, hot air flows from said hot air supply, through said first, second, third, and fourth inlet passages into said nozzle opening, over at least a portion of the top of the integrated circuit component, and out of said nozzle opening via said exhaust passages.

34. The device of claim 30 wherein said first and second inlet passages open into said nozzle opening at respective inlet ports and wherein said inlet ports are substantially rectilinear and disposed adjacent and substantially parallel to said inner peripheral wall.

35. The device of claim 30 wherein said at least one exhaust passage is disposed substantially normal to said heat distribution plate.

* * * * *